(12) United States Patent
Lien et al.

(10) Patent No.: US 11,972,122 B2
(45) Date of Patent: Apr. 30, 2024

(54) MEMORY READ OPERATION USING A VOLTAGE PATTERN BASED ON A READ COMMAND TYPE

(71) Applicant: Micron Technology, Inc., Boise, ID (US)

(72) Inventors: Yu-Chung Lien, San Jose, CA (US); Ching-Huang Lu, Fremont, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/817,465

(22) Filed: Aug. 4, 2022

(65) Prior Publication Data
US 2024/0045601 A1 Feb. 8, 2024

(51) Int. Cl.
*G06F 3/06* (2006.01)

(52) U.S. Cl.
CPC .......... *G06F 3/0625* (2013.01); *G06F 3/0653* (2013.01); *G06F 3/0673* (2013.01)

(58) Field of Classification Search
CPC ..... G06F 3/0625; G06F 3/0653; G06F 3/0673
See application file for complete search history.

(56) References Cited

U.S. PATENT DOCUMENTS

| | | | | |
|---|---|---|---|---|
| 2019/0286518 A1* | 9/2019 | Asami | ............... | G06F 11/1012 |
| 2021/0311830 A1* | 10/2021 | Lee | ............... | G11C 29/52 |
| 2022/0147275 A1* | 5/2022 | Yu | ............... | G11C 16/26 |
| 2022/0222138 A1* | 7/2022 | Park | ............... | G11C 16/0483 |
| 2023/0153201 A1* | 5/2023 | Oh | ............... | G11C 11/5642 |
| | | | | 714/764 |
| 2023/0251781 A1* | 8/2023 | Son | ............... | G06F 3/0653 |
| | | | | 711/103 |

OTHER PUBLICATIONS

Co-pending U.S. Appl. No. 17/881,180, entitled "Management of Dynamic Read Voltage Sequences in a Memory Subsystem," by Yu-Chung Lien, filed Aug. 4, 2022.

* cited by examiner

*Primary Examiner* — Edward J Dudek, Jr.
(74) *Attorney, Agent, or Firm* — Harrity & Harrity, LLP

(57) ABSTRACT

In some implementations, a memory device may detect a read command associated with reading data stored by the memory device. The memory device may determine whether the read command is from a host device in communication with the memory device. The memory device may select, based on whether the read command is from the host device, one of a first voltage pattern or a second voltage pattern to be applied to memory cells of the memory device to execute the read command, wherein the first voltage pattern is selected if the read command is from the host device and the second voltage pattern is selected if the read command is not from the host device, wherein the second voltage pattern is different from the first voltage pattern. The memory device may execute the read command using a selected one of the first voltage pattern or the second voltage pattern.

25 Claims, 11 Drawing Sheets

MEMORY READ OPERATION USING A VOLTAGE PATTERN BASED ON A READ COMMAND TYPE

TECHNICAL FIELD

The present disclosure generally relates to memory devices, memory device operations, and, for example, to a memory read operation that uses a voltage pattern that is based on a read command type.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, the electronic device may write to, or program, a set of memory cells. To access the stored information, the electronic device may read, or sense, the stored state from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), holographic RAM (HRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source.

DETAILED DESCRIPTION

Figure 1:
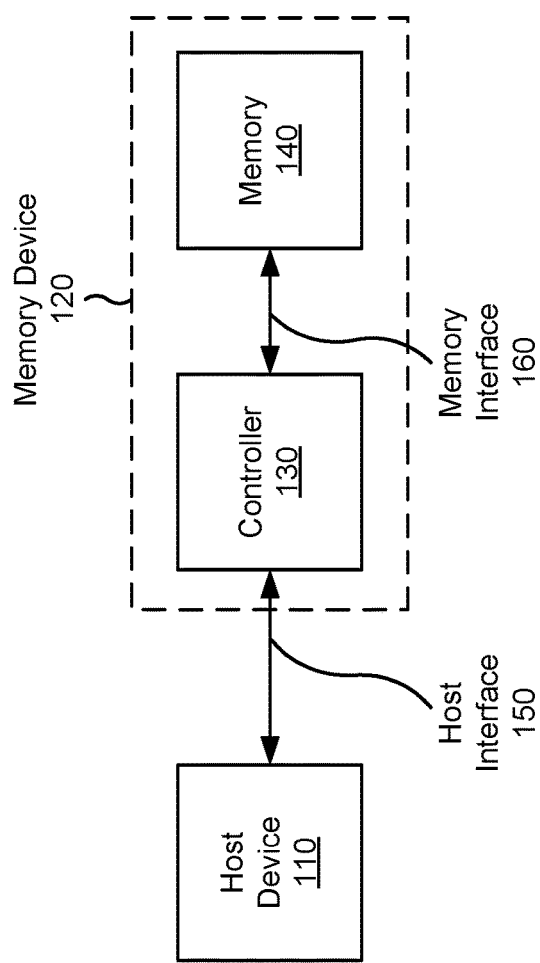
FIG. 1 is a diagram illustrating an example system capable of selecting and using a voltage pattern, for a memory read operation, that is based on a read command type.

Power consumption and performance are important factors for memory device design and operation. Often, these factors compete with one another. For example, an increase in performance may require increased power consumption, and a reduction in power consumption may result in poorer performance. As a more specific example, the amount of power consumed by a memory read operation and a read time for the memory read operation may depend on a voltage pattern used to read data from memory cells. A voltage pattern is a variation in voltage over time, and a read voltage pattern is a variation, over time, in a read voltage applied to one or more access lines (sometimes called word lines) to read data from memory cells. A "fast read voltage pattern" may enable a faster read time than a "slow read voltage patten," but may require more power (compared to a slow read voltage pattern) to perform a read operation to achieve that faster read time. Conversely, a slow read voltage pattern may consume less power than a fast read voltage pattern to perform a read operation, but may result in a slower read time than the fast read voltage pattern.

Power consumption can depend on peak current and average current, which are both important considerations for many types of systems. In some cases, always maintaining the fastest possible read time may not be desirable because of the resulting power consumption. For example, a system can malfunction if the peak current exceeds a power limitation of the system, which may result in a voltage drop of a voltage supplied to or used by the system. As another example, in systems where battery life is important (e.g., mobile devices and laptop computers), a higher average current consumes more power over time than a lower average current, resulting in shorter battery life. In general, lower power consumption is desirable for sustainability and energy savings, but must be balanced with performance requirements, such as lower latency (e.g., shorter read times).

Some systems, like data center solid state drives (SSDs), may have restrictive idle power requirements, where the power consumption of the system cannot exceed a certain threshold (e.g., 5 watts) while the system is in an idle mode (e.g., is not processing commands from a host device). While in the idle mode, the system may perform various operations that consume power, such as a data integrity scan to verify the integrity of stored data (e.g., to verify that the data is not corrupt), an error handling operation to correct corrupted data (e.g., identified during the data integrity scan), or the like. As the number of chips and semiconductor dies included in an SSD increase, it is increasingly difficult to comply with idle power requirements and keep power consumption low while performing these idle mode operations.

Some systems may use a fast read voltage pattern (e.g., a reverse read voltage pattern, described in more detail elsewhere herein) to achieve faster read times. However, a fast read time may not be necessary for all types of read operations. For example, a fast read time may be more important for host read commands (e.g., read commands received from a host device) and may be less important for non-host read commands (e.g., for a data integrity scan or an error handling operation). Some implementations described herein enable a memory device to select and use a type of read voltage pattern based on a read command type for which the read voltage pattern is to be used. Although maintaining and using multiple read voltage patterns and selecting a read voltage pattern to use in different scenarios may increase system complexity, this enables fast read times in scenarios where performance is more important than reduced power consumption, and this also reduces power consumption by using slow read times in scenarios where performance is less important than reduced power consumption.

FIG. 1 is a diagram illustrating an example system 100 capable of selecting and using a voltage pattern, for a memory read operation, that is based on a read command type. The system 100 may include one or more devices, apparatuses, and/or components for performing operations described herein. For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, a device in a data center, a device in a cloud computing environment, a vehicle (e.g., an automobile or an airplane), and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

The memory device 120 may be any electronic device configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device. In this case, the memory 140 may include non-volatile memory configured to maintain stored data after the memory device 120 is powered off. For example, the memory 140 may include NAND memory or NOR memory. In some implementations, the memory 140 may include volatile memory that requires power to maintain stored data and that loses stored data after the memory device 120 is powered off, such as one or more latches and/or random-access memory (RAM), such as dynamic RAM (DRAM) and/or static RAM (SRAM). For example, the volatile memory may cache data read from or to be written to non-volatile memory, and/or may cache instructions to be executed by the controller 130.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include a memory controller, a system controller, an ASIC, an FPGA, a processor, a microcontroller, and/or one or more processing components. In some implementations, the controller 130 may be a high-level controller, which may communicate directly with the host device 110 and may instruct one or more low-level controllers regarding memory operations to be performed in connection with the memory 140. In some implementations, the controller 130 may be a low-level controller, which may receive instructions regarding memory operations from a high-level controller that interfaces directly with the host device 110. As an example, a high-level controller may be an SSD controller, and a low-level controller may be a non-volatile memory controller (e.g., a NAND controller) or a volatile memory controller (e.g., a DRAM controller). In some implementations, a set of operations described herein as being performed by the controller 130 may be performed by a single controller (e.g., the entire set of operations may be performed by a single high-level controller or a single low-level controller). Alternatively, a set of operations described herein as being performed by the controller 130 may be performed by more than one controller (e.g., a first subset of the operations may be performed by a high-level controller and a second subset of the operations may be performed by a low-level controller).

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

In some implementations, the memory device 120 and/or the controller 130 may be configured to select and use a read voltage pattern based on a read command type for which the read voltage pattern is to be used. For example, the memory device 120 and/or the controller 130 may be configured to select a first read voltage pattern for a host read command (e.g., a read command received from the host device 110), and the memory device 120 and/or the controller 130 may be configured to select a second (different) read voltage pattern for a non-host read command (e.g., a read command that is not received from the host device 110). This may enable fast read times in scenarios where performance is more important than reduced power consumption. Furthermore, this may reduce power consumption by using slow read times in scenarios where performance is less important than reduced power consumption.

As indicated above, FIG. 1 is provided as an example. Other examples may differ from what is described with regard to FIG. 1.

Figure 2:
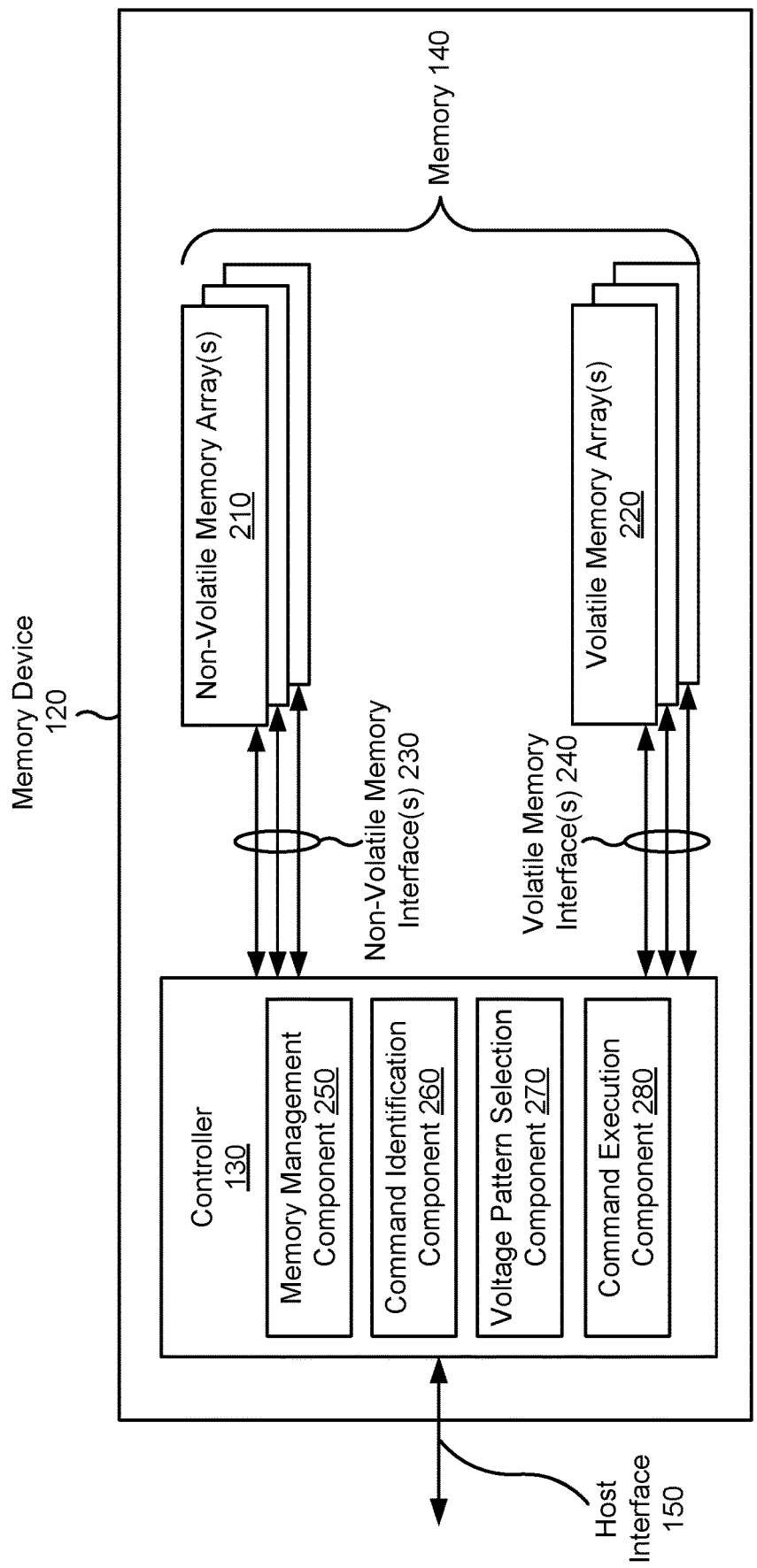
FIGS. 2 and 3 are diagrams of example components included in a memory device.

FIG. 2 is a diagram of example components included in a memory device 120. As described above in connection with FIG. 1, the memory device 120 may include a controller 130 and memory 140. As shown in FIG. 2, the memory 140 may include one or more non-volatile memory arrays 210, such as one or more NAND memory arrays and/or one or more NOR memory arrays. Additionally, or alternatively, the memory 140 may include one or more volatile memory arrays 220, such as one or more SRAM arrays and/or one or more DRAM arrays. The controller 130 may transmit signals to and receive signals from a non-volatile memory array 210 using a non-volatile memory interface 230. The controller 130 may transmit signals to and receive signals from a volatile memory array 220 using a volatile memory interface 240.

The controller 130 may control operations of the memory 140, such as by executing one or more instructions. For example, the memory device 120 may store one or more instructions in the memory 140 as firmware, and the controller 130 may execute those one or more instructions.

Additionally, or alternatively, the controller 130 may receive one or more instructions from the host device 110 via the host interface 150, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hardwired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 250, a command identification component 260, a voltage pattern selection component 270, and/or a command execution component 280. In some implementations, one or more of these components are implemented as one or more instructions (e.g., firmware) executed by the controller 130. Alternatively, one or more of these components may be implemented as dedicated integrated circuits distinct from the controller 130.

The memory management component 250 may be configured to manage performance of the memory device 120. For example, the memory management component 250 may perform wear leveling, bad block management, block retirement, read disturb management, a data integrity scan (e.g., a data verification operation), an error handling operation (e.g., a corrective read operation), and/or other memory management operations. In some implementations, the memory device 120 may store (e.g., in memory 140) one or more memory management tables. A memory management table may store information that may be used by or updated by the memory management component 250, such as information regarding memory block age, memory block erase count, and/or error information associated with a memory partition (e.g., a memory cell, a row of memory, a block of memory, or the like).

The command identification component 260 may be configured to determine a type of read command to be executed by the memory device 120, as described in more detail elsewhere herein. For example, the command identification component 260 may be configured to determine whether a read command is a host read command or a non-host read command, as described in more detail elsewhere herein.

The voltage pattern selection component 270 may be configured to select a voltage pattern (e.g., a read voltage pattern) to be used to execute the read command, as described in more detail elsewhere herein. For example, the voltage pattern selection component 270 may be configured to select the voltage pattern based on the type of read command identified by the command identification component 260, as described in more detail elsewhere herein.

The command execution component 280 may be configured to execute the read command using a selected voltage pattern, as described in more detail elsewhere herein. For example, the command execution component 280 may be configured to apply the voltage pattern selected by the voltage pattern selection component 270 to perform a read operation, as described in more detail elsewhere herein.

Figure 5:
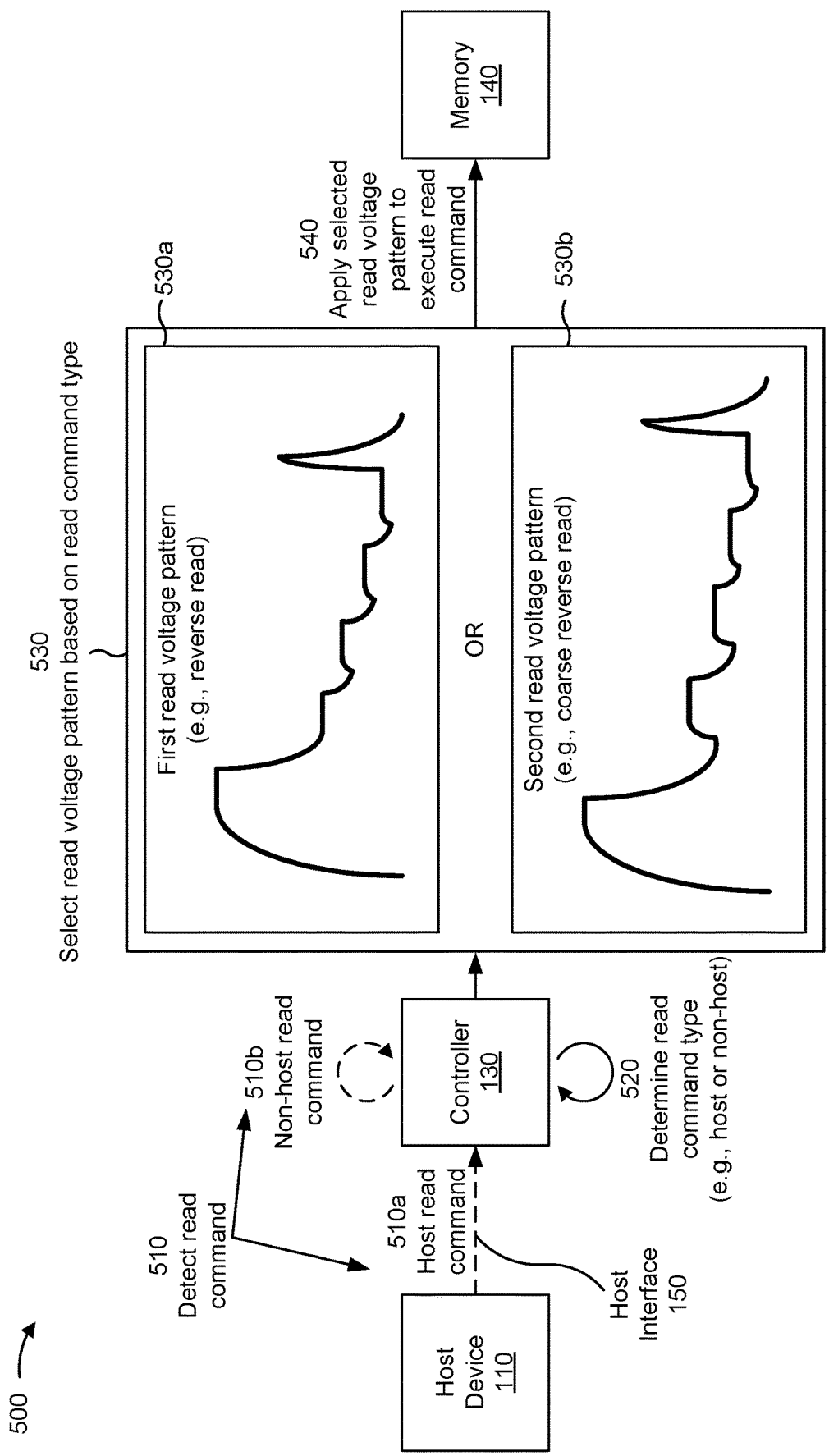
FIG. 5 is a diagram illustrating an example of a memory read operation that uses a voltage pattern that is based on a read command type.
Figure 6:
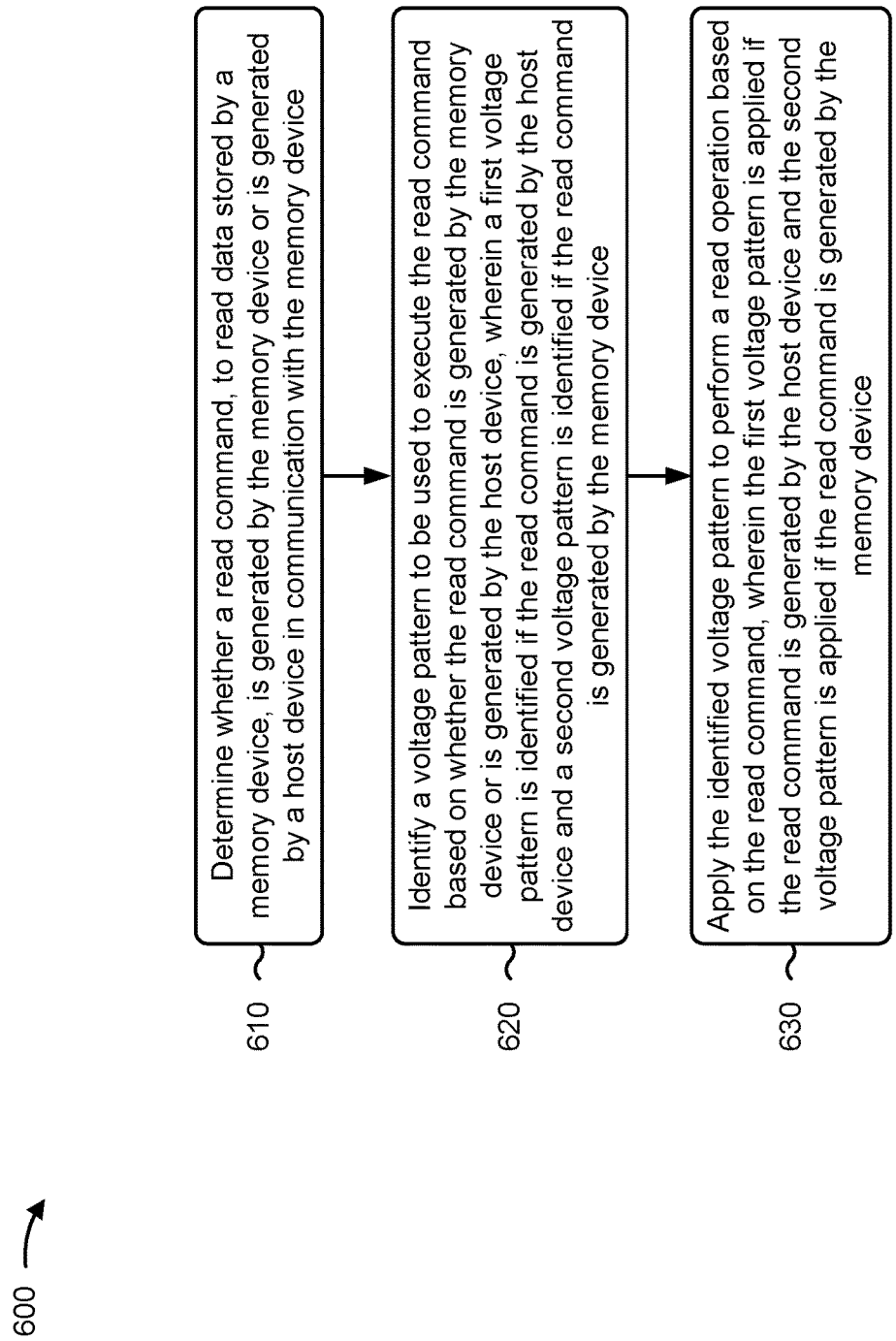
FIGS. 6-8 are flowcharts of example methods associated with selecting and using a voltage pattern, for a memory read operation, that is based on a read command type.
Figure 7:
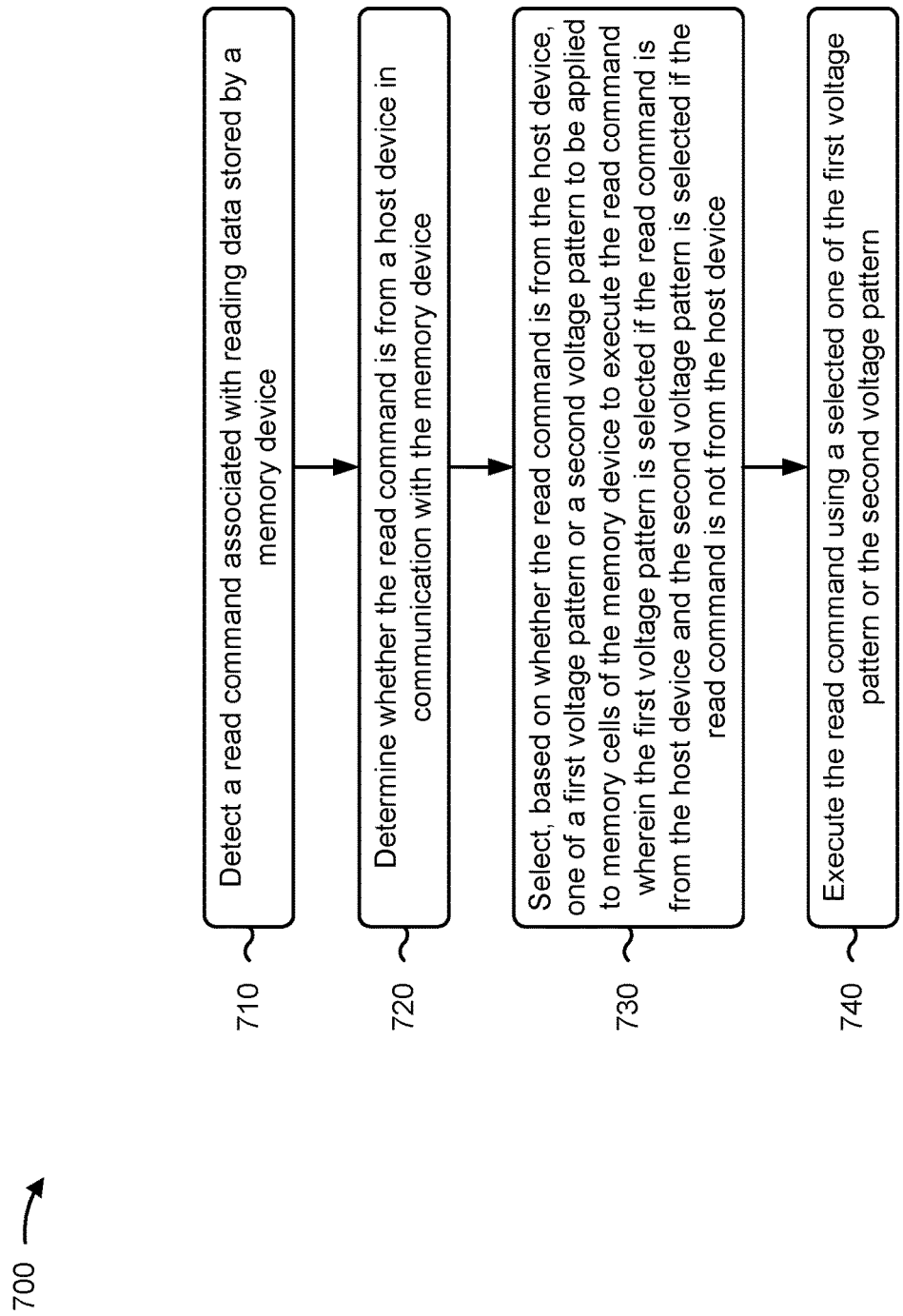
Figure 8:
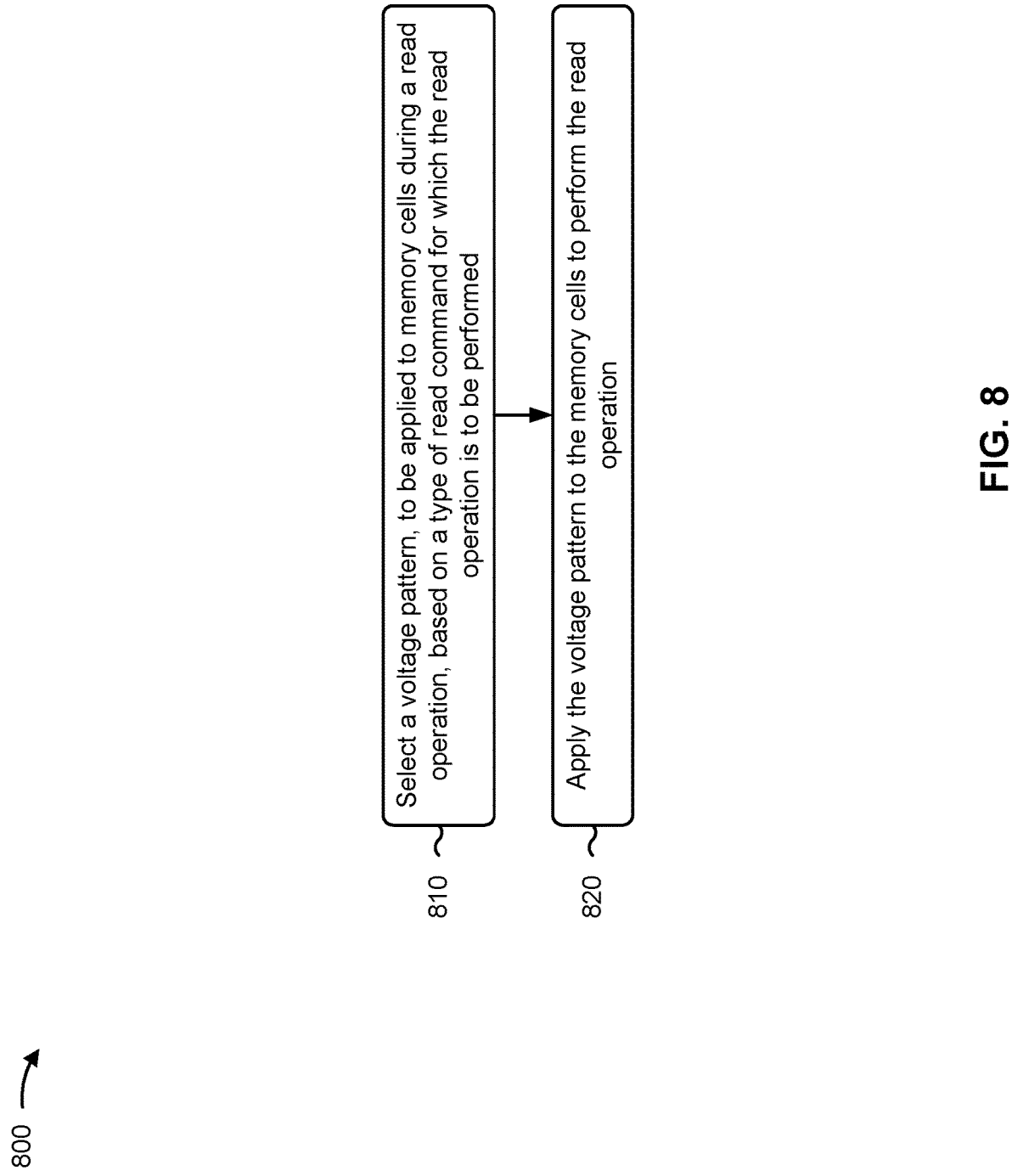

One or more devices or components shown in FIG. 2 may be used to perform operations described elsewhere herein, such as one or more operations of FIG. 5 and/or one or more process blocks of the methods of FIGS. 6-8. For example, the controller 130, the memory management component 250, the command identification component 260, the voltage pattern selection component 270, and/or the command execution component 280 may perform one or more operations and/or methods for the memory device 120.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

Figure 3:
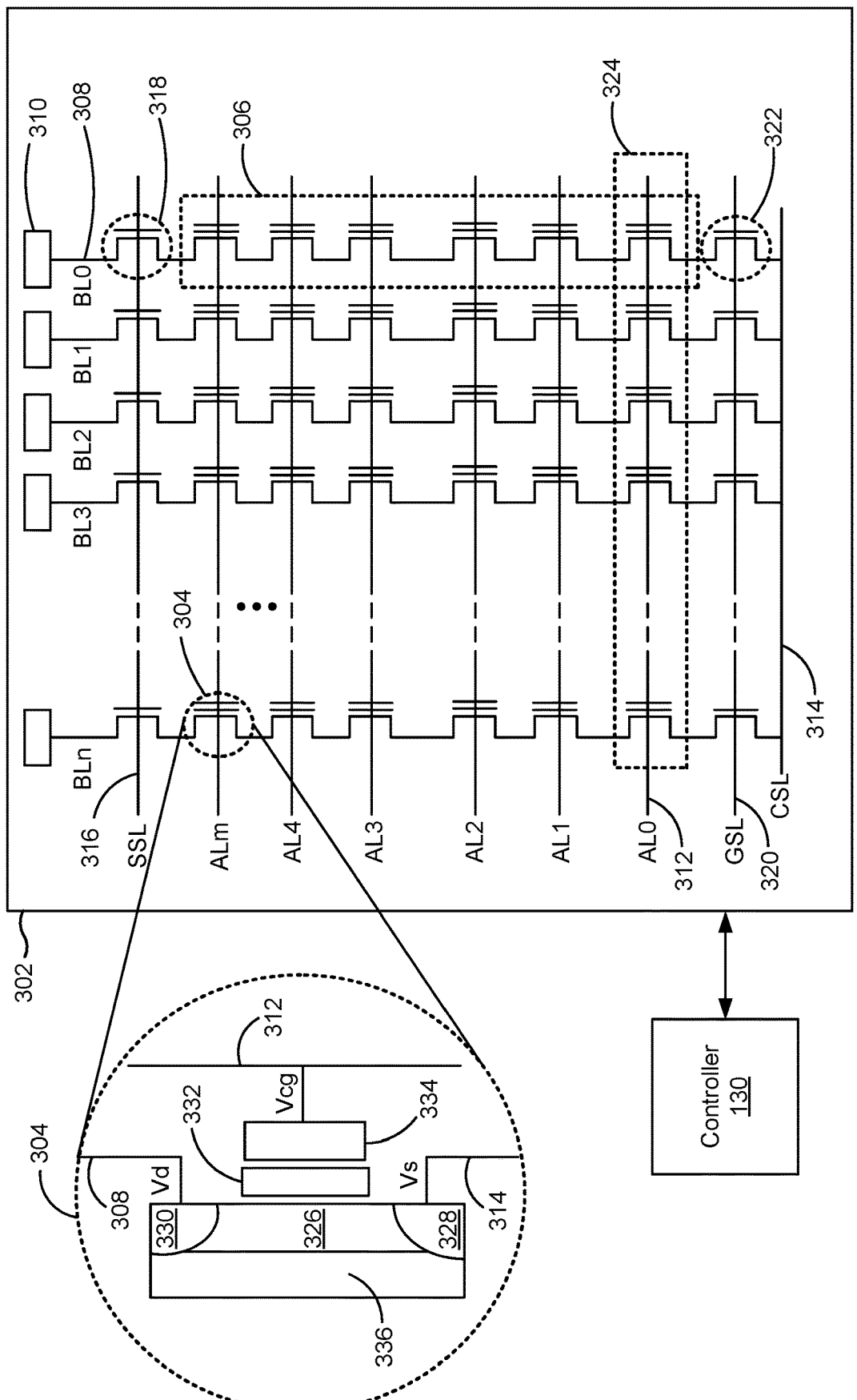

FIG. 3 is a diagram of example components included in a memory device 120. As described above in connection with FIG. 1, the memory device 120 may include a controller 130 and memory 140. As shown in FIG. 3, the memory 140 may include a memory array 302, which may correspond to a non-volatile memory array 210 described above in connection with FIG. 2.

In FIG. 3, the memory array 302 is a NAND memory array. However, in some implementations, the memory array 302 may be another type of memory array, such as a NOR memory array, a resistive RAM (RRAM) memory array, a magnetoresistive RAM (MRAM) memory array, a ferroelectric RAM (FeRAM) memory array, a spin-transfer torque RAM (STT-RAM) memory array, or the like. In some implementations, the memory array 302 is part of a three-dimensional stack of memory arrays, such as 3D NAND flash memory, 3D NOR flash memory, or the like.

The memory array 302 includes multiple memory cells 304. A memory cell 304 may store an analog value, such as an electrical voltage or an electrical charge, that represents a data state (e.g., a digital value). The analog value and corresponding data state depend on a quantity of electrons trapped or present within a region of the memory cell 304 (e.g., in a charge trap, such as a floating gate), as described below.

A NAND string 306 (sometimes called a string) may include multiple memory cells 304 connected in series. A NAND string 306 is coupled to a bit line 308 (sometimes called a digit line or a column line, and shown as BL0-BLn).

Data can be read from or written to the memory cells 304 of a NAND string 306 via a corresponding bit line 308 using one or more input/output (I/O) components 310 (e.g., an I/O circuit, an I/O bus, a page buffer, and/or a sensing component, such as a sense amplifier). Memory cells 304 of different NAND strings 306 (e.g., one memory cell 304 per NAND string 306) may be coupled with one another via access lines 312 (sometimes called word lines or row lines, and shown as AL0-ALm) that select which row (or rows) of memory cells 304 is affected by a memory operations (e.g., a read operation or a write operation, sometimes called a program operation).

A NAND string 306 may be connected to a bit line 308 at one end and a common source line (CSL) 314 at the other end. A string select line (SSL) 316 may be used to control respective string select transistors 318. A string select transistor 318 selectively couples a NAND string 306 to a corresponding bit line 308. A ground select line (GSL) 320 may be used to control respective ground select transistors 322. A ground select transistor 322 selectively couples a NAND string 306 to the common source line 314.

A "page" of memory (or "a memory page") may refer to a group of memory cells 304 connected to the same access line 312, as shown by reference number 324. In some implementations (e.g., for single-level cells), the memory cells 304 connected to an access line 312 may be associated with a single page of memory. In some implementations (e.g., for multi-level cells), the memory cells 304 connected to an access line 312 may be associated with multiple pages of memory, where each page represents one bit stored in each of the memory cells 304 (e.g., a lower page that represents a first bit stored in each memory cell 304 and an upper page that represents a second bit stored in each memory cell 304). In NAND memory, a page is the smallest physically addressable data unit for a write operation (sometimes called a program operation).

In some implementations, a memory cell 304 is a floating-gate transistor memory cell. In this case, the memory cell 304 may include a channel 326, a source region 328, a drain region 330, a floating gate 332, and a control gate 334. The source region 328, the drain region 330, and the channel 326 may be on a substrate 336 (e.g., a semiconductor substrate). The memory device 120 may store a data state in the memory cell 304 by charging the floating gate 332 to a particular voltage associated with the data state and/or to a voltage that is within a range of voltages associated with the data state. This results in a predefined amount of current flowing through the channel 326 (e.g., from the source region 328 to the drain region 330) when a specified read voltage is applied to the control gate 334 (e.g., by a corresponding access line 312 connected to the control gate 334). Although not shown, a tunnel oxide layer (or tunnel dielectric layer) may be interposed between the floating gate 332 and the channel 326, and a gate oxide layer (e.g., a gate dielectric layer) may be interposed between the floating gate 332 and the control gate 334. As shown, a drain voltage Vd may be supplied from a bit line 308, a control gate voltage Vcg may be supplied from an access line 312, and a source voltage Vs may be supplied via the common source line 314 (which, in some implementations, is a ground voltage).

To write or program the memory cell 304, Fowler-Nordheim tunneling may be used. For example, a strong positive voltage potential may be created between the control gate 334 and the channel 326 (e.g., by applying a large positive voltage to the control gate 334 via a corresponding access line 312) while current is flowing through the channel 326 (e.g., from the common source line 314 to the bit line 308, or vice versa). The strong positive voltage at the control gate 334 causes electrons within the channel 326 to tunnel through the tunnel oxide layer and be trapped in the floating gate 332. These negatively charged electrons then act as an electron barrier between the control gate 334 and the channel 326 that increases the threshold voltage of the memory cell 304. The threshold voltage is a voltage required at the control gate 334 to cause current (e.g., a threshold amount of current) to flow through the channel 326. Fowler-Nordheim tunneling is an example technique for storing a charge in the floating gate, and other techniques, such as channel hot electron injection, may be used.

To read the memory cell 304, a read voltage may be applied to the control gate 334 (e.g., via a corresponding access line 312), and an I/O component 310 (e.g., a sense amplifier) may determine the data state of the memory cell 304 based on whether or not current passes through the memory cell 304 (e.g., the channel 326) due to the applied voltage. A pass voltage may be applied to all memory cells 304 (other than the memory cell 304 being read) in the same NAND string 306 as the memory cell 304 being read. For example, the pass voltage may be applied on each access line 312 other than the access line 312 of the memory cell 304 being read (e.g., where the read voltage is applied). The pass voltage is higher than the highest read voltage associated with any memory cell data states so that all of the other memory cells 304 in the NAND string 306 conduct, and the I/O component 310 can detect a data state of the memory cell 304 being read by sensing current (or lack thereof) on a corresponding bit line 308. For example, in a single-level memory cell that stores one of two data states, the data state is a "1" if current is detected, and the data state is a "0" if current is not detected. In a multi-level memory cell that stores one of three or more data states, multiple read voltages are applied, over time, to the control gate 334 to distinguish between the three or more data states and determine a data state of the memory cell 304.

To erase the memory cell 304, a strong negative voltage potential may be created between the control gate 334 and the channel 326 (e.g., by applying a large negative voltage to the control gate 334 via a corresponding access line 312). The strong negative voltage at the control gate 334 causes trapped electrons in the floating gate 332 to tunnel back across the oxide layer from the floating gate 332 to the channel 326 and to flow between the common source line 314 and the bit line 308. This removes the electron barrier between the control gate 334 and the channel 326 and decreases the threshold voltage of the memory cell 304 (e.g., to an empty or erased state, which may represent a "1").

As indicated above, FIG. 3 is provided as an example. Other examples may differ from what is described with regard to FIG. 3.

Figure 4A:
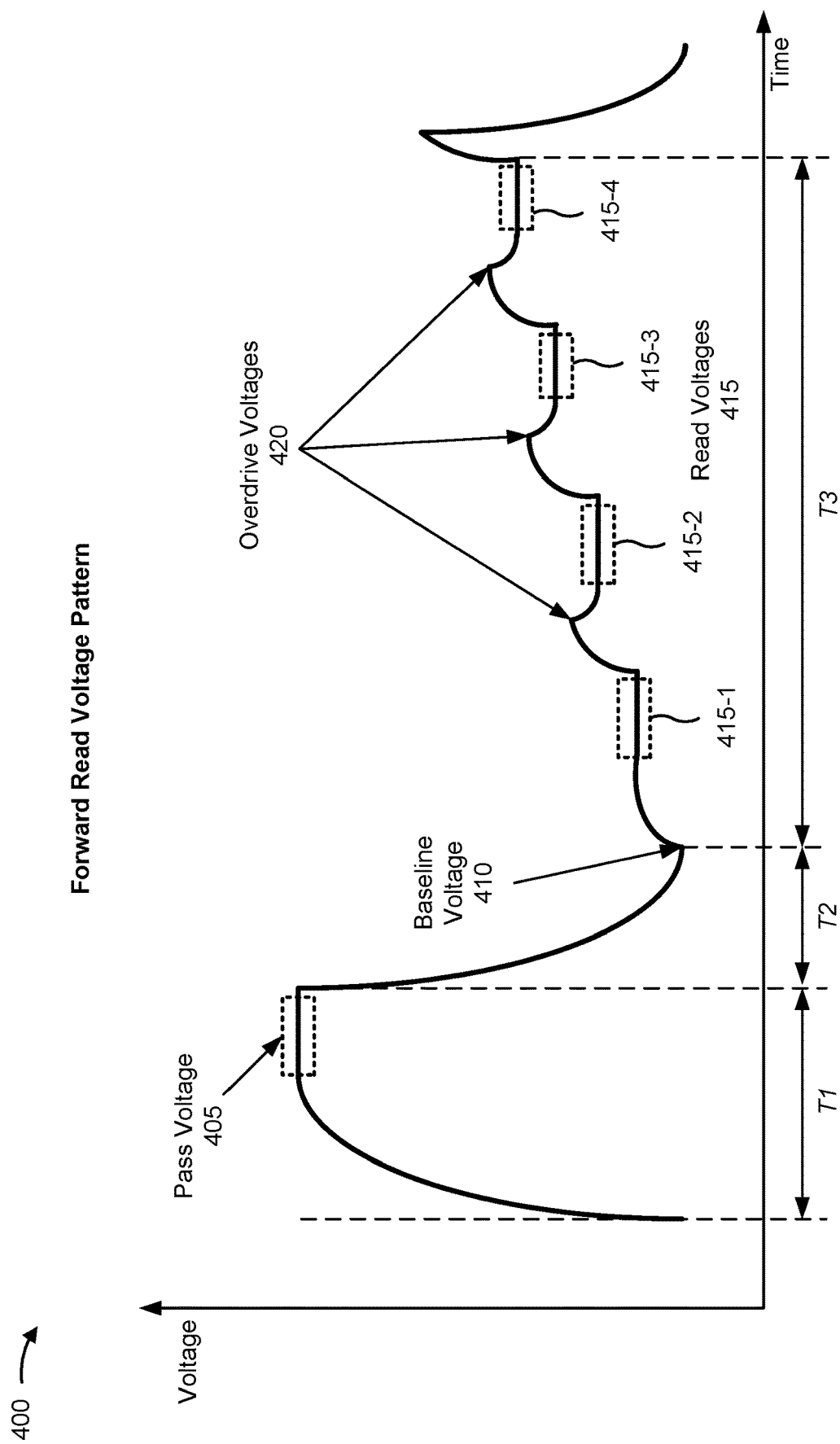
FIGS. 4A-4C are diagrams of example read voltage patterns.
Figure 4B:
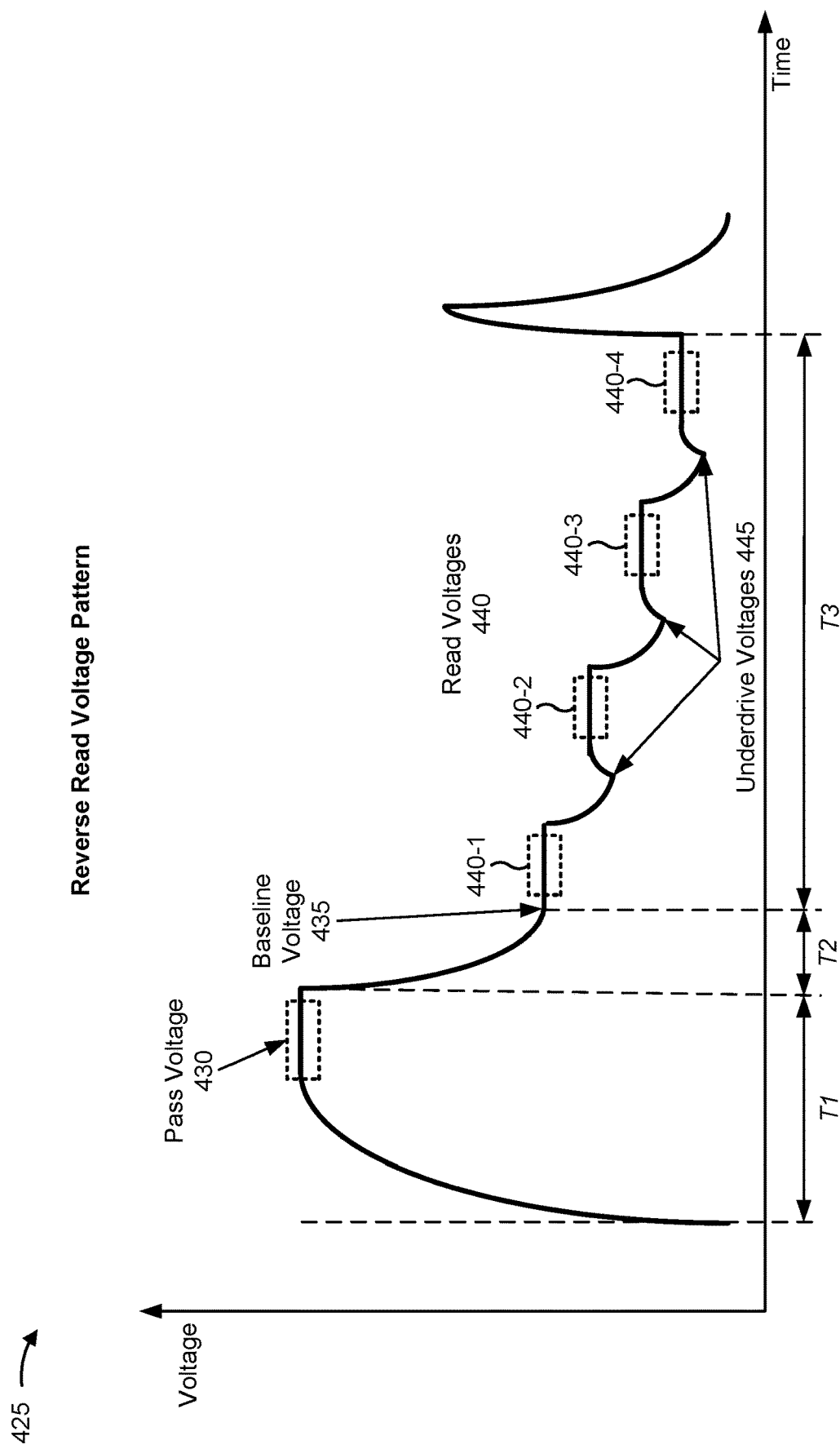
Figure 4C:
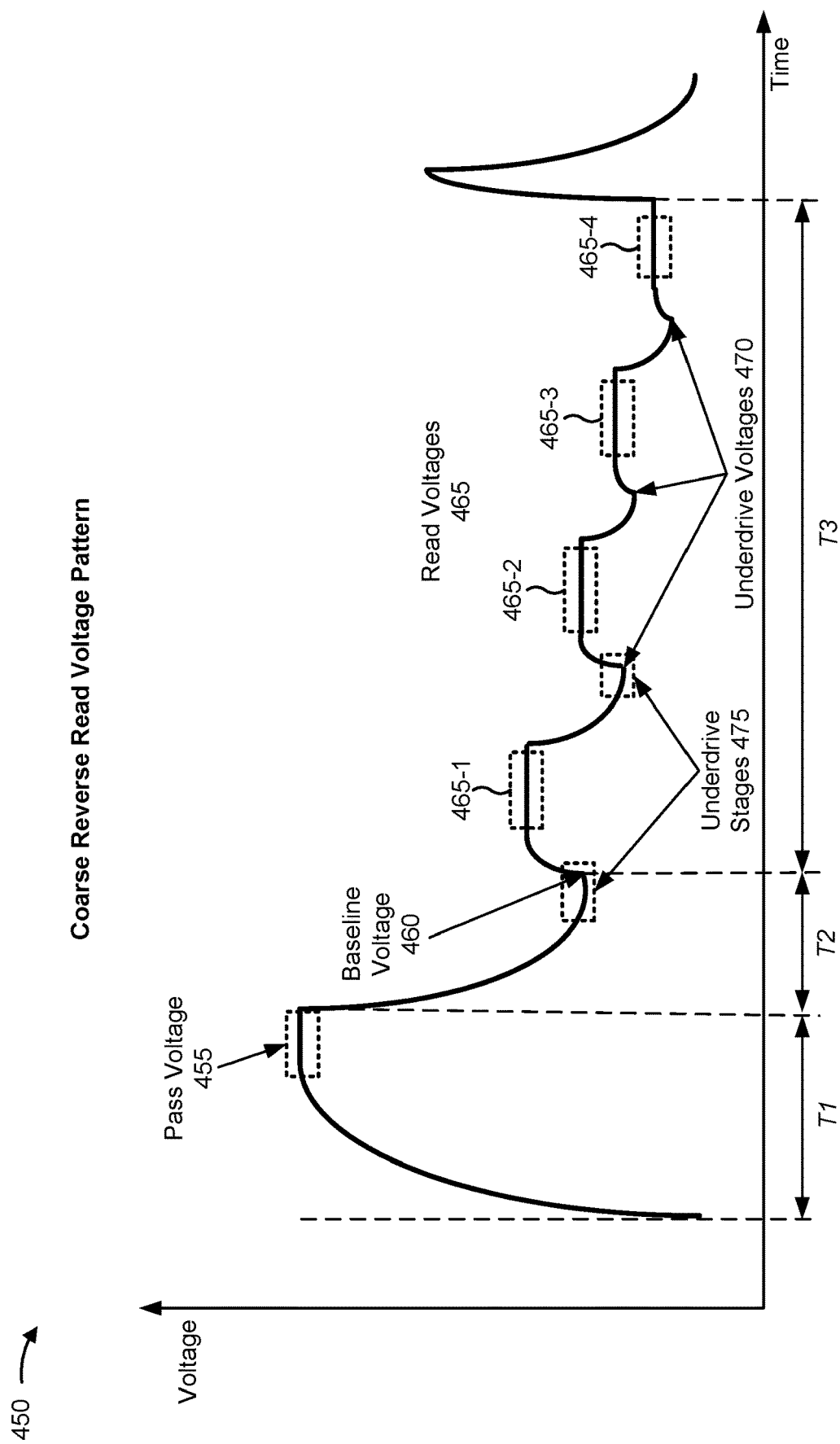

FIGS. 4A-4C are diagrams of example read voltage patterns. FIG. 4A shows an example forward read voltage pattern, FIG. 4B shows an example reverse read voltage pattern, and FIG. 4C shows an example coarse reverse read voltage pattern. The reverse read voltage pattern shown in FIG. 4B may be called a "default reverse read voltage pattern" to distinguish from the coarse reverse read voltage pattern shown in FIG. 4C. The read voltage patterns shown in FIGS. 4A-4C and described herein are provided as examples, and other read voltage patterns may be used in connection with the operations described herein. The illustrated read voltage patterns may be used by a memory device 120 to read data from memory cells by applying a series of read voltages. A read voltage is sometimes called a read reference voltage.

As shown in FIG. 4A, when a memory device 120 performs an example forward read operation 400 (e.g., using a forward read voltage pattern), the memory device 120 first applies a pass voltage 405 to a selected access line during a first time period T1 to drain residual electrons from the selected access line. The pass voltage 405 may be greater than all of the subsequent read voltages. After applying the pass voltage 405, the memory device 120 may reduce the voltage on the selected access line to a baseline voltage 410 during a second time period T2. When performing the forward read operation 400, the memory device 120 may then iteratively increase a read voltage 415 and perform a sensing operation over a series of iterations during a third time period T3. For example, the memory device 120 may increase the voltage to a first read voltage 415-1 and perform a first sensing operation, may further increase the voltage to a second read voltage 415-2 and perform a second sensing operation, may further increase the voltage to a third read voltage 415-3 and perform a third sensing operation, and may further increase the voltage to a fourth read voltage 415-4 and perform a fourth sensing operation.

In some implementations, when performing the forward read operation 400, the memory device 120 may apply an overdrive voltage 420 to increase the applied voltage, on the selected access line, to be greater than an immediately subsequent read voltage 415, and the memory device 120 may then reduce the applied voltage to that read voltage 415. Because some memory cells on the access line are located farther away from a voltage source that applies the voltage, these memory cells take a longer time to reach the read voltage 415 than memory cells on the access line that are nearer to the voltage source. By applying an overdrive voltage 420 that is greater than an immediately subsequent read voltage 415, and then decreasing the applied voltage down to that read voltage 415, the memory cells that are farther away from the voltage source can reach the read voltage 415 more quickly than if the overdrive voltage 420 were not applied. Although not shown in FIG. 4A, in some implementations, the memory device 120 may apply an overdrive voltage 420 prior to the first read voltage 415-1 (similar to what is illustrated in FIG. 4A for the second, third, and fourth read voltages).

During each sensing operation, the memory device 120 may detect whether the read voltage 415 applied to a memory cell causes that memory cell to conduct (e.g., whether current flows through the memory cell when the read voltage 415 is applied). By applying multiple read voltages 415 to a memory cell, such as a multi-level memory cell capable of storing more than two data states, the memory device 120 can determine a read voltage 415 at which the memory cell conducts, and thus can determine the threshold voltage and corresponding data state of the memory cell.

In the forward read operation 400, a read voltage 415, used for a series of read instances included in the forward read operation 400, is increased over time (e.g., from the first read voltage 415-1 to the fourth read voltage 415-4). Because the voltage is increased over time, a smaller quantity of memory cells may conduct when earlier read voltages 415 are applied (e.g., read voltage 415-1, read voltage 415-2), and a greater quantity of memory cells may conduct when later read voltages 415 are applied (e.g., read voltage 415-3, read voltage 415-4). Furthermore, the memory device 120 can determine the data state of a memory cell at the earliest instance at which the memory cell conducts (e.g., at the earliest instance of an applied read voltage 415 that causes the memory cell to conduct) because that memory cell has a threshold voltage that is either equal to the read voltage applied at that instance or that is between the read voltage applied at that instance and a read voltage applied at an immediately preceding instance. Thus, to conserve power when performing the forward read operation 400, the memory device 120 can refrain from performing all subsequent sensing operations (e.g., in connection with read voltage 415-3 and read voltage 415-4) for every memory cell for which the memory device 120 has determined the data state based on an earlier performed sensing operation. Thus, as described in more detail below in connection with FIG. 4B, the forward read operation 400 may consume less power than the reverse read operation described below in connection with FIG. 4B. However, as also described below in connection with FIG. 4B, the forward read operation 400 may have a longer read time than the reverse read operation described below in connection with FIG. 4B.

As shown in FIG. 4B, when a memory device 120 performs an example reverse read operation 425 (e.g., using a reverse read voltage pattern), the memory device 120 first applies a pass voltage 430 to a selected access line during a first time period T1 to drain residual electrons from the selected access line. The pass voltage 430 may be greater than all of the subsequent read voltages. After applying the pass voltage 430, the memory device 120 may reduce the voltage on the selected access line to a baseline voltage 435 during a second time period T2. The baseline voltage 435 used in the reverse read operation 425 is greater than the baseline voltage 410 used in the forward read operation 400, which means that less time is required in the reverse read operation 425, as compared to the forward read operation 400, to decrease the applied voltage from the pass voltage to the baseline voltage. In other words, the time period T2 is shorter for the reverse read operation 425 as compared to the forward read operation 400. As a result, the reverse read operation 425 may be faster (e.g., may have a shorter read time) than the forward read operation 400.

When performing the reverse read operation 425 and after reducing the voltage to the baseline voltage 435, the memory device 120 may then iteratively decrease a read voltage 440 and perform a sensing operation over a series of iterations during a third time period T3. For example, the memory device 120 may decrease the voltage to a first read voltage 440-1 and perform a first sensing operation, may further decrease the voltage to a second read voltage 440-2 and perform a second sensing operation, may further decrease the voltage to a third read voltage 440-3 and perform a third sensing operation, and may further decrease the voltage to a fourth read voltage 440-4 and perform a fourth sensing operation.

In some implementations, when performing the reverse read operation 425, the memory device 120 may apply an underdrive voltage 445 to decrease the applied voltage, on the selected access line, to be less than an immediately subsequent read voltage 440, and the memory device 120 may then increase the applied voltage to that read voltage 440. Because some memory cells on the access line are located farther away from a voltage source that applies the voltage, these memory cells take a longer time to reach the read voltage 440 than memory cells on the access line that are nearer to the voltage source. By applying an underdrive voltage 445 that is less than an immediately subsequent read voltage 440, and then increasing the applied voltage up to that read voltage 440, the memory cells that are farther away from the voltage source can reach the read voltage 440 more quickly than if the underdrive voltage 445 were not applied. Although not shown in FIG. 4B, in some implementations, the baseline voltage 435 may be an underdrive voltage that is less than the first read voltage 440-1 (similar to what is illustrated in FIG. 4C for a coarse reverse read voltage operation). In some cases, applying an underdrive voltage takes less time than applying an overdrive voltage having the same magnitude as the underdrive voltage, which further contributes to the reverse read operation 425 being faster (e.g., having a shorter read time) than the forward read operation 400.

During each sensing operation, the memory device 120 may detect whether the read voltage 440 applied to a memory cell causes that memory cell to conduct (e.g., whether current flows through the memory cell when the read voltage 440 is applied). By applying multiple read voltages 440 to a memory cell, such as a multi-level memory cell capable of storing more than two data states, the memory device 120 can determine a read voltage 440 at which the memory cell conducts, and thus can determine the threshold voltage and corresponding data state of the memory cell.

In the reverse read operation 425, a read voltage 440, used for a series of read instances included in the reverse read operation 425, is decreased over time (e.g., from the first read voltage 440-1 to the fourth read voltage 440-4). Because the voltage is decreased over time, a greater quantity of memory cells may conduct when earlier read voltages 440 are applied (e.g., read voltage 440-1, read voltage 440-2), and a smaller quantity of memory cells may conduct when later read voltages 440 are applied (e.g., read voltage 440-3, read voltage 440-4). Furthermore, the memory device 120 cannot determine the data state of a memory cell at the earliest instance at which the memory cell conducts (e.g., at the earliest instance of an applied read voltage 415 that causes the memory cell to conduct) because that memory cell may also conduct at a later instance (and the memory device 120 cannot identify the data state of the memory cell until the memory cell switches from conducting to not conducting at consecutive instances).

Thus, the memory device 120 performs more sensing operations in the reverse read operation 425 than in the forward read operation 400, and a greater quantity of memory cells conduct over the time period T3 in the reverse read operation 425 as compared to the forward read operation 400. In other words, in the forward read operation 400, when the memory device 120 detects that a memory cell conducts at a particular read voltage, then the memory device 120 can identify the data state for that memory cell and can refrain from performing a sensing operation for that memory cell for future read voltages during the forward read operation 400. In the reverse read operation 425, when the memory device 120 detects that a memory cell conducts at a particular read voltage, the memory device 120 cannot yet identify the data state for that memory cell, and must continue to perform a sensing operation for that memory cell for future read voltages during the reverse read operation 425 (e.g., until the memory cell does not conduct at a subsequent read voltage, at which time the memory device 120 can determine the data state of the memory cell). As a result, the reverse read operation 425 consumes more power than the forward read operation 400. However, the reverse read operation 425 may have a faster read time (or a shorter read time) than the forward read operation 400 (e.g., because of the shorter time period T2 in the reverse read operation 425 as compared to the forward read operation 400). The read time (e.g., an overall read time) may be equal to the length of T1, T2, and T3 combined.

As shown in FIG. 4C, when a memory device 120 performs an example coarse reverse read operation 450 (e.g., using a coarse reverse read voltage pattern), the memory device 120 first applies a pass voltage 455 to a selected access line during a first time period T1 to drain residual electrons from the selected access line. The pass voltage 455 may be greater than all of the subsequent read voltages. After applying the pass voltage 455, the memory device 120 may reduce the voltage on the selected access line to a baseline voltage 460 during a second time period T2. The baseline voltage 460 used in the coarse reverse read operation 450 may be greater than the baseline voltage 410 used in the forward read operation 400, which means that less time is required in the coarse reverse read operation 450, as compared to the forward read operation 400, to decrease the applied voltage from the pass voltage to the baseline voltage. In other words, the time period T2 may be shorter for the coarse reverse read operation 450 as compared to the forward read operation 400.

When performing the coarse reverse read operation 450 and after reducing the voltage to the baseline voltage 460, the memory device 120 may then iteratively decrease a read voltage 465 and perform a stable sensing operation over a series of iterations during a third time period T3. For example, the memory device 120 may decrease the voltage to a first read voltage 465-1 and perform a first stable sensing operation, may further decrease the voltage to a second read voltage 465-2 and perform a second stable sensing operation, may further decrease the voltage to a third read voltage 465-3 and perform a third stable sensing operation, and may further decrease the voltage to a fourth read voltage 465-4 and perform a fourth stable sensing operation. A "stable sensing operation" refers to a sensing operation that is performed after the read voltage 465 has stabilized (e.g., to a target read voltage, within a threshold degree of tolerance), as shown by the dashed line rectangles associated with the read voltages 465-1, 465-2, 465-3, and 465-4 in FIG. 4C.

In some implementations, when performing the coarse reverse read operation 450, the memory device 120 may apply an underdrive voltage 470 to decrease the applied voltage, on the selected access line, to be less than an immediately subsequent read voltage 465, and the memory device 120 may then increase the applied voltage to that read voltage 465, for a similar reason as described above in connection with FIG. 4B. In the coarse reverse read operation 450, each underdrive voltage 470 may be less than a corresponding underdrive voltage 445 used in the reverse read operation 425. In other words, the voltage difference between a read voltage and an immediately subsequent underdrive voltage (e.g., used for the next read voltage) may be greater in the coarse reverse read operation 450 as compared to the reverse read operation 425. As a result, it takes more time for the memory device 120 to apply underdrive voltages in the coarse reverse read operation 450 as compared to the reverse read operation 425, resulting in a slower (e.g., longer) read time for the coarse reverse read operation 450 as compared to the reverse read operation 425.

In the coarse reverse read operation 450, a transient sensing operation is performed during an underdrive stage 475. In the underdrive stage 475, the applied voltage is less than the immediately subsequent read voltage 465, and the applied voltage is transient (e.g., not stable, within a threshold degree of tolerance, during the entire sensing operation). In some implementations, the transient sensing operation is performed when the applied voltage is equal to the underdrive voltage 470. However, the applied voltage may be changing while the transient sensing operation is being performed, as opposed to the stable sensing operation that is performed after the applied voltage has stabilized (e.g., to a read voltage 465). Thus, "a transient sensing operation" refers to a sensing operation that is performed while the applied voltage is transient (e.g., prior to the applied voltage stabilizing to a target read voltage), as shown by the dashed line rectangles associated with the underdrive stages 475 in FIG. 4C.

The memory device 120 may perform the transient sensing operation to identify memory cells that conduct during the sensing operation and memory cells that do not conduct during the transient sensing operation. Then, the memory device 120 may perform an immediately subsequent stable sensing operation (e.g., after the applied voltage has stabilized to a read voltage 465) on only the memory cells that do not conduct during the transient sensing operation. In other words, the memory device 120 may refrain from performing the immediately subsequent stable sensing operation on the memory cells that conduct during the transient sensing operation (e.g., because those memory cells will also conduct during the subsequent stable sensing operation due to the underdrive voltage 470 being less than the immediately subsequent read voltage 465, and thus the memory device 120 will not be able to determine a data state for those memory cells).

In some implementations, the memory device 120 may perform the transient sensing operation only in connection with earlier sensing operations (e.g., associated with the first read voltage 465-1 and/or the second read voltage 465-2), and not in connection with later sensing operations (e.g., associated with the third read voltage 465-3 and/or the fourth read voltage 465-4) because the benefit of eliminating memory cells from being sensed during the stable sensing operation is more beneficial for earlier sensing operations (e.g., because more memory cells are eliminated from sensing). Thus, the memory device 120 may apply a "deeper" underdrive (e.g., to a lower voltage as compared to corresponding underdrive voltages of the reverse read operation 425) to only a subset of read instances that occur earlier in the coarse reverse read operation 450 (e.g., prior to applying the first read voltage 465-1 and/or the second read voltage 465-2, but not prior to applying the third read voltage 465-3 and/or the fourth read voltage 465-4), thereby resulting in a faster read time than if the deeper underdrive were applied prior to all read instances.

Because the memory device 120 performs the stable sensing operation on fewer memory cells in the coarse reverse read operation 450 as compared to the reverse read operation 425, the coarse reverse read operation 450 consumes less power than the reverse read operation 425. However, the coarse reverse read operation 450 may have a slower read time (or a longer read time) than the reverse read operation 425 due to the additional time to apply a lower underdrive voltage in the coarse reverse read operation 450 as compared to the reverse read operation 425.

As indicated above, FIGS. 4A-4C are provided as examples. Other examples may differ from what is described with regard to FIGS. 4A-4C. For example, although four iterations, four read voltages, four overdrive voltages, and four sensing operations are shown and described in connection with FIGS. 4A-4C, a different quantity of iterations, read voltages, overdrive voltages, and sensing operations may be used by the memory device 120 (e.g., two, three, six, eight, and so on). For example, the read voltage patterns 400, 425, and 450 may be used in connection with a quad-level cell (QLC) that stores four bits per memory cell. Different read voltage patterns than those shown in FIGS. 4A-4C may be used in connection with other types of memory cells, such as a triple-level cell (TLC) that stores three bits per memory cell, a penta-level cell (PLC) that stores five bits per memory cell, and so on. Additionally, or alternatively, the memory device 120 may use different read voltage patterns (e.g., with different voltages applied for read voltages, overdrive voltages, underdrive voltages, baseline voltages, and/or pass voltages) than those illustrated in FIGS. 4A-4C.

FIG. 5 is a diagram illustrating an example 500 of a memory read operation that uses a voltage pattern that is based on a read command type. The operations described in connection with FIG. 5 may be performed by the memory device 120 and/or one or more components of the memory device 120, such as the controller 130.

As shown by reference number 510, the controller 130 may detect a read command. The read command may include a command to read data stored by the memory device 120 (e.g., in the memory 140). As shown by reference number 510a, the read command may be a host read command. Alternatively, as shown by reference number 510b, the read command may be a non-host read command. As shown by reference number 520, the controller 130 may determine a read command type (e.g., a type of the read command), such as whether the read command is a host read command or a non-host read command.

A host read command may be a read command that is received from the host device 110. For example, the host read command may be generated by and/or received from a host device 110 that is in communication with the memory device 120. In some implementations, the host read command is received by the memory device 120 via the host interface 150. The host read command may be a command instructing the memory device 120 to read data from the memory 140 and provide that data to the host device 110 (e.g., via the host interface). In some implementations, the controller 130 may determine that the read command is a host read command based on the read command being received from the host device 110, based on the read command being received via the host interface 150 (e.g., a particular interface and/or pin of the memory device 120), based on the read command not being generated internally by the memory device 120, and/or based on the read command including a particular value or instruction (e.g., an instruction to read data from the memory 140 and provide that data to the host device 110).

A non-host read command may be a read command that is not received from the host device 110. For example, the non-host read command may be generated by the memory device 120 and/or the controller 130 (e.g., for performing one or more internally-initiated operations). The non-host read command may be a read command that does not include an instruction for the memory device 120 to provide data, read from the memory 140, to the host device 110. In some implementations, the controller 130 may determine that the read command is a non-host read command based on the read command not being received from the host device 110, based on the read command not being received via the host interface 150 (e.g., a particular interface and/or pin of the memory device 120), based on the read command being generated internally by the memory device 120, based on the read command being initiated internally by the memory device 120, and/or based on the read command lacking a particular value or instruction (e.g., an instruction to read data from the memory 140 and provide that data to the host device 110).

In some implementations, the non-host read command may include a read command associated with a data integrity scan. In this case, the controller 130 may determine that the read command is a non-host read command based on the read command being associated with a data integrity scan. A data integrity scan may include one or more data verification operations to determine a health status of the memory 140 (e.g., one or more blocks of the memory 140). For example, the data integrity scan may include executing one or more read commands and determining an error rate associated with corresponding data read from the memory 140.

Additionally, or alternatively, the non-host read command may include a read command associated with an error handling operation, such as a corrective read operation. In this case, the controller 130 may determine that the read command is a non-host read command based on the read command being associated with an error handling operation. An error handling operation may include executing a read command and comparing the read data with expected data, may include calculating an error rate (based on the comparison), may include detecting one or more errors in the read data, may include identifying one or more memory locations associated with a read error, and/or may include performing one or more error correction operations (e.g., using an error correction code or ECC).

Additionally, or alternatively, the non-host read command may include a read command associated with an idle mode operation. For example, a non-host read command may be triggered or may occur when the memory device 120 is in an idle mode (e.g., is not actively communicating with the host device 110) and/or is subject to an idle mode power restriction (e.g., where a peak current or average current must remain below or equal to a threshold).

As shown by reference number 530, the controller 130 may select a voltage pattern (e.g., a read voltage pattern) based on the read command type. For example, the controller 130 may select a first read voltage pattern 530a if the read command is a first type of read command. Similarly, the controller 130 may select a second read voltage pattern 530b (e.g., that is different from the first read voltage pattern 530a) if the read command is a second type of read command. For example, the controller 130 may select the first read voltage pattern 530a if the read command is a host read command, and may select the second read voltage pattern 530b if the read command is a non-host read command (e.g., if the read command is associated with or part of a data integrity scan or an error handling operation).

As shown in FIG. 5, in some implementations, the first read voltage pattern 530a is a reverse read voltage pattern, such as the reverse read voltage pattern described above in connection with FIG. 4B. As described in more detail above in connection with FIG. 4B, in a reverse read voltage pattern, a read voltage, used for a series of read instances included in the reverse read voltage pattern, decreases over time (e.g., during the reverse read operation or within the reverse read voltage pattern). In some implementations, in a reverse read voltage pattern (as opposed to a coarse reverse read voltage pattern), memory cells are read only after the read voltage is stable, as described in more detail above in connection with FIG. 4B.

As further shown in FIG. 5, in some implementations, the second read voltage pattern 530b is a coarse reverse read voltage pattern, such as the coarse reverse read voltage pattern described above in connection with FIG. 4C. As described in more detail above in connection with FIG. 4C, in a coarse reverse read voltage pattern, a read voltage, used for a series of read instances included in the reverse read voltage pattern, decreases over time (e.g., during the coarse reverse read operation or within the coarse reverse read voltage pattern). In some implementations, in a coarse reverse read voltage pattern (as opposed to a reverse read voltage pattern), memory cells are read prior to the read voltage being stable (e.g., in a transient sensing operation) and after the read voltage is stable (e.g., in a stable sensing operation), as described in more detail above in connection with FIG. 4C.

The read voltage patterns shown in FIG. 5 are provided as an example. In FIG. 5, the first read voltage pattern 530a is a reverse read voltage pattern, and the second read voltage pattern 530b is a coarse reverse read voltage pattern. This enables faster read times (with a tradeoff of increased power consumption) by using the reverse read voltage pattern in scenarios where fast read times are more important than reduced power consumption (e.g., for host read commands that are time-sensitive), and this also reduces power consumption (with a tradeoff of slower read times) by using the coarse reverse read voltage pattern in scenarios where reduced power consumption is more important than fast read times (e.g., for an idle mode operation where power restrictions cannot be exceeded).

In some implementations, the first read voltage pattern 530a may correspond to a first type of reverse read operation, and the second read voltage pattern 530b may correspond to a second type of reverse read operation (e.g., that is different from the first type of reverse read operation). In the first type of reverse read operation, a first read voltage, used for a first series of read instances included in the first type of reverse read operation, decreases over time. Similarly, in the second type of reverse read operation, a second read voltage, used for a second series of read instances included in the second type of reverse read operation, decreases over time within the second voltage pattern. In other words, the disclosure is not limited to the reverse read voltage pattern shown in FIG. 4B and the coarse reverse read voltage pattern shown in FIG. 4C, and can include other types of reverse read voltage patterns.

Using different types of reverse read operations may reduce system complexity as compared to using a reverse read operation for the first read voltage pattern 530a and a forward read operation for the second read voltage pattern 530b. However, using a forward read operation may be beneficial in some scenarios (e.g., for faster read times or reduced power consumption). Thus, in some implementations, the first read voltage pattern 530a may be a reverse read voltage pattern, and the second read voltage pattern 530b may be a forward read voltage pattern, such as the forward read voltage pattern described above in connection with FIG. 4A. As described in more detail above in connection with FIG. 4A, in a forward read voltage pattern, a read voltage, used for a series of read instances included in the forward read voltage pattern, increases over time (e.g., during the forward read operation or within the forward read voltage pattern). This enables faster read times (with a tradeoff of increased power consumption) by using the reverse read voltage pattern in scenarios where fast read times are more important than reduced power consumption, and this also reduces power consumption (with a tradeoff of slower read times) by using the forward read voltage pattern in scenarios where reduced power consumption is more important than fast read times.

More generally, the first read voltage pattern 530a may be associated with a shorter read time (or a faster read time) than the second read voltage pattern 530b. In other words, the second read voltage pattern 530b may be associated with a longer read time (or a slower read time) than the first read voltage pattern 530a. Additionally, or alternatively, the first read voltage pattern 530a may consume more power (e.g., may result in a greater current draw, a greater peak current, and/or a greater average current during the read voltage pattern) than the second read voltage pattern 530b. In other words, the second read voltage pattern 530b may consume less power (e.g., may result in a lower current draw, a lower peak current, and/or a lower average current during the read voltage pattern) than the first read voltage pattern 530a. This enables faster read times (with a tradeoff of increased power consumption) by using the first read voltage pattern 530a in scenarios where fast read times are more important than reduced power consumption, and this also reduces power consumption (with a tradeoff of slower read times) by using the second read voltage pattern 530b in scenarios where reduced power consumption is more important than fast read times.

In some implementations, the controller 130 may select a read voltage pattern based on information stored in memory 140 of the controller 130. For example, the memory 140 may store control information for use by the controller 130, such as a table that indicates a mapping between different types of read commands and corresponding read voltage patterns. The controller 130 may select the read voltage pattern by identifying a read voltage pattern, indicated in the table, that corresponds to the read command type identified by the controller 130.

As shown by reference number 540, the controller 130 may apply the selected voltage read pattern to execute the read command (e.g., to perform a read operation). For example, the controller 130 may execute the read command by applying the first read voltage pattern 530a if the controller 130 selects the first read voltage pattern 530a (e.g., if the read command is a host read command). Similarly, the controller 130 may execute the read command by applying the second read voltage pattern 530b if the controller 130 selects the second read voltage pattern 530b (e.g., if the read command is a non-host read command). The controller 130 may apply a voltage pattern by controlling a voltage of one or more selected access lines over time and/or performing sensing operations over time, as described above in connection with FIGS. 4A-4C.

The controller 130 may read data from the memory 140 based on executing the read command. If the read command is a host read command, then the controller 130 may provide the read data to the host device 110 via the host interface 150. If the read command is non-host read command, then the controller 130 may use the read data for one or more internal operations described above (e.g., a data integrity scan, an error handling operation, and/or an idle mode operation).

Although a host command and non-host command are used as examples of different read command types, other read command types are within the scope of the disclosure. In general, the controller 130 may determine a read command type of a read command, and may select a read voltage pattern based on the read command type. In some implementations, the memory device 120 may store mapping information that indicates an association between read command types and corresponding read voltage patterns to be used for those read command types. The memory device 120 may use that mapping information to select a read voltage pattern based on an identified read command type. In some implementations, multiple read command types may be associated with a single read voltage pattern. Additionally, or alternatively, a single read command type may be associated with a single read voltage pattern. Although the controller 130 is shown as selecting between two different read voltage patterns in FIG. 5, in some implementations, the controller 130 may select among more than two different read voltage patterns (e.g., three read voltage patterns or four read voltage patterns) based on the read command type.

By enabling the memory device 120 to select and use a read voltage pattern (e.g., from multiple options) based on a read command type for which the read voltage pattern is to be used, fast read times may be achieved in scenarios where performance is more important than reduced power consumption, and reduced power consumption may be achieved in scenarios where performance is less important than reduced power consumption.

As indicated above, FIG. 5 is provided as an example. Other examples may differ from what is described with regard to FIG. 5.

FIG. 6 is a flowchart of an example method 600 associated with selecting and using a voltage pattern, for a memory read operation, that is based on a read command type. In some implementations, a memory device (e.g., memory device 120) may perform or may be configured to perform one or more process blocks of FIG. 6. In some implementations, another device or a group of devices separate from or including the memory device may perform or may be configured to perform one or more process blocks of FIG. 6. Additionally, or alternatively, one or more components of the memory device (e.g., the controller 130, the memory management component 250, the command identification component 260, the voltage pattern selection component 270, and/or the command execution component 280) may perform or may be configured to perform one or more process blocks of FIG. 6.

As shown in FIG. 6, the method 600 may include determining whether a read command, to read data stored by a memory device, is generated by the memory device or is generated by a host device in communication with the memory device (block 610). As further shown in FIG. 6, the method 600 may include identifying a voltage pattern to be used to execute the read command based on whether the read command is generated by the memory device or is generated by the host device, wherein a first voltage pattern is identified if the read command is generated by the host device and a second voltage pattern is identified if the read command is generated by the memory device, wherein the second voltage pattern is different from the first voltage pattern (block 620). As further shown in FIG. 6, the method 600 may include applying the identified voltage pattern to perform a read operation based on the read command, wherein the first voltage pattern is applied if the read command is generated by the host device and the second voltage pattern is applied if the read command is generated by the memory device (block 630).

Although FIG. 6 shows example blocks of a method 600, in some implementations, the method 600 may include additional blocks, fewer blocks, different blocks, or differently arranged blocks than those depicted in FIG. 6. Additionally, or alternatively, two or more of the blocks of the method 600 may be performed in parallel. The method 600 is an example of one method that may be performed by one or more devices described herein. These one or more devices may perform or may be configured to perform one or more other methods based on operations described herein, such as the operations described in connection with FIG. 5.

FIG. 7 is a flowchart of an example method 700 associated with selecting and using a voltage pattern, for a memory read operation, that is based on a read command type. In some implementations, a memory device (e.g., memory device 120) may perform or may be configured to perform one or more process blocks of FIG. 7. In some implementations, another device or a group of devices separate from or including the memory device may perform or may be configured to perform one or more process blocks of FIG. 7. Additionally, or alternatively, one or more components of the memory device (e.g., the controller 130, the memory management component 250, the command identification component 260, the voltage pattern selection component 270, and/or the command execution component 280) may perform or may be configured to perform one or more process blocks of FIG. 7.

As shown in FIG. 7, the method 700 may include detecting a read command associated with reading data stored by a memory device (block 710). As further shown in FIG. 7, the method 700 may include determining whether the read command is from a host device in communication with the memory device (block 720). As further shown in FIG. 7, the method 700 may include selecting, based on whether the read command is from the host device, one of a first voltage pattern or a second voltage pattern to be applied to memory cells of the memory device to execute the read command, wherein the first voltage pattern is selected if the read command is from the host device and the second voltage pattern is selected if the read command is not from the host device, wherein the second voltage pattern is different from the first voltage pattern (block 730). As further shown in FIG. 7, the method 700 may include executing the read command using a selected one of the first voltage pattern or the second voltage pattern (block 740).

Although FIG. 7 shows example blocks of a method 700, in some implementations, the method 700 may include additional blocks, fewer blocks, different blocks, or differently arranged blocks than those depicted in FIG. 7. Additionally, or alternatively, two or more of the blocks of the method 700 may be performed in parallel. The method 700 is an example of one method that may be performed by one or more devices described herein. These one or more devices may perform or may be configured to perform one or more other methods based on operations described herein, such as the operations described in connection with FIG. 5.

FIG. 8 is a flowchart of an example method 800 associated with selecting and using a voltage pattern, for a memory read operation, that is based on a read command type. In some implementations, a memory device (e.g., memory device 120) may perform or may be configured to perform one or more process blocks of FIG. 8. In some implementations, another device or a group of devices separate from or including the memory device may perform or may be configured to perform one or more process blocks of FIG. 8. Additionally, or alternatively, one or more components of the memory device (e.g., the controller 130, the memory management component 250, the command identification component 260, the voltage pattern selection component 270, and/or the command execution component 280) may perform or may be configured to perform one or more process blocks of FIG. 8.

As shown in FIG. 8, the method 800 may include selecting a voltage pattern, to be applied to memory cells during a read operation, based on a type of read command for which the read operation is to be performed (block 810). As further shown in FIG. 8, the method 800 may include applying the voltage pattern to the memory cells to perform the read operation (block 820).

Although FIG. 8 shows example blocks of a method 800, in some implementations, the method 800 may include additional blocks, fewer blocks, different blocks, or differently arranged blocks than those depicted in FIG. 8. Additionally, or alternatively, two or more of the blocks of the method 800 may be performed in parallel. The method 800 is an example of one method that may be performed by one or more devices described herein. These one or more devices may perform or may be configured to perform one or more other methods based on operations described herein, such as the operations described in connection with FIG. 5.

Figure 9:
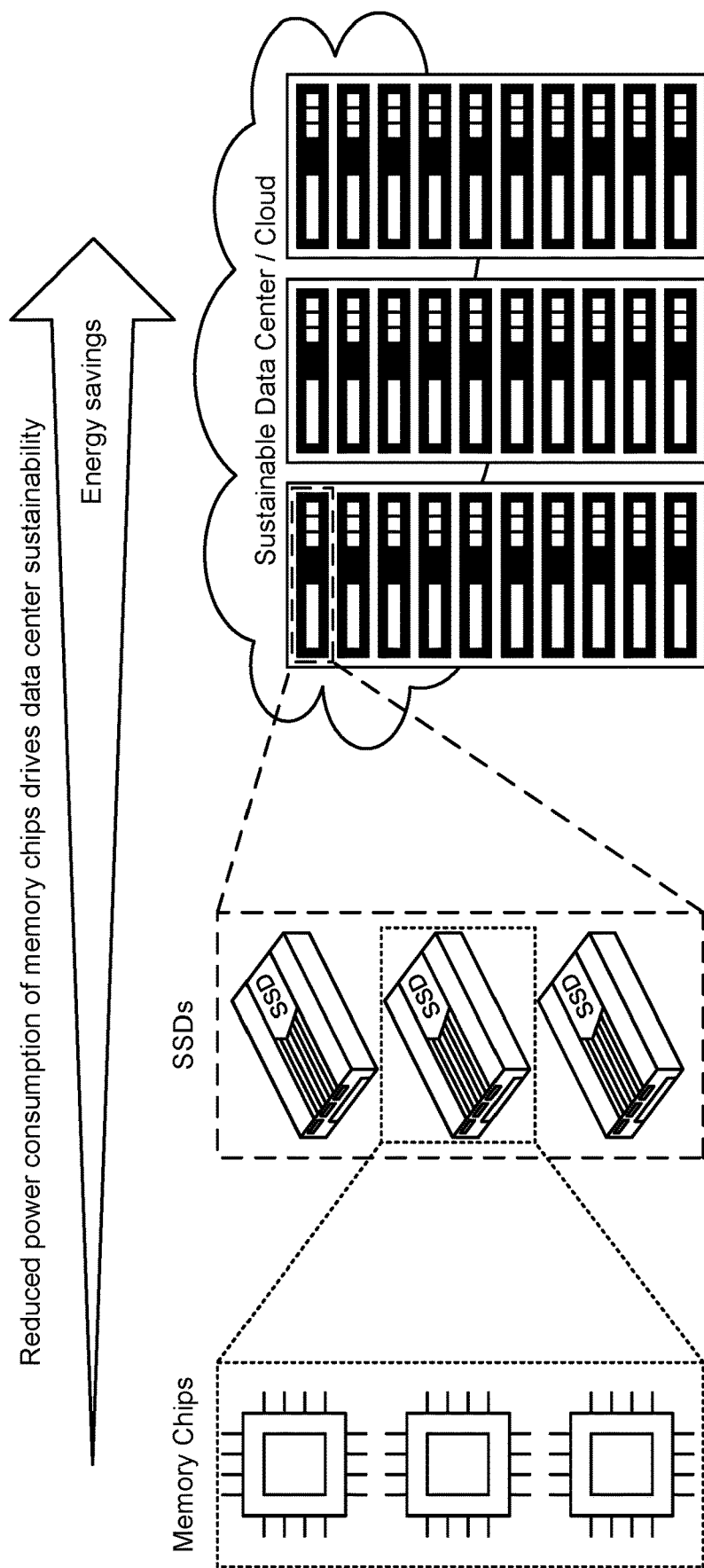
FIG. 9 is a diagram illustrating example systems in which the memory device described herein may be used.

FIG. 9 is a diagram illustrating example systems in which the memory device 120 described herein may be used. In some implementations, one or more memory devices 120 may be included in a memory chip. Multiple memory chips may be packaged together and included in a higher level system, such as a solid state drive (SSD) or another type of memory drive. Each SSD may include, for example, up to five memory chips, up to ten memory chips, or more. A data center or cloud computing environment may include multiple SSDs to store a large amount of data. For example, a data center may include hundreds, thousands, or more SSDs.

As described above, some implementations described herein reduce power consumption of a memory device 120. As shown in FIG. 9, this reduced power consumption drives data center sustainability and leads to energy savings because of the large volume of memory devices 120 included in a data center.

As indicated above, FIG. 9 is provided as an example. Other examples may differ from what is described with regard to FIG. 9.

In some implementations, a memory device includes one or more components configured to: determine whether a read command, to read data stored by the memory device, is generated by the memory device or is generated by a host device in communication with the memory device; identify a voltage pattern to be used to execute the read command based on whether the read command is generated by the memory device or is generated by the host device, wherein a first voltage pattern is identified if the read command is generated by the host device and a second voltage pattern is identified if the read command is generated by the memory device, wherein the second voltage pattern is different from the first voltage pattern; and apply the identified voltage pattern to perform a read operation based on the read command, wherein the first voltage pattern is applied if the read command is generated by the host device and the second voltage pattern is applied if the read command is generated by the memory device.

In some implementations, a method includes detecting, by a memory device, a read command associated with reading data stored by the memory device; determining, by the memory device, whether the read command is from a host device in communication with the memory device; selecting, by the memory device and based on whether the read command is from the host device, one of a first voltage pattern or a second voltage pattern to be applied to memory cells of the memory device to execute the read command, wherein the first voltage pattern is selected if the read command is from the host device and the second voltage pattern is selected if the read command is not from the host device, wherein the second voltage pattern is different from the first voltage pattern; and executing, by the memory device, the read command using a selected one of the first voltage pattern or the second voltage pattern.

In some implementations, a system includes means for selecting a voltage pattern, to be applied to memory cells during a read operation, based on a type of read command for which the read operation is to be performed; and means for applying the voltage pattern to the memory cells to perform the read operation.

The foregoing disclosure provides illustration and description but is not intended to be exhaustive or to limit the implementations to the precise forms disclosed. Modifications and variations may be made in light of the above disclosure or may be acquired from practice of the implementations described herein.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory device, comprising:
    one or more components configured to:
        determine whether a read command, to read data stored by the memory device, is generated by the memory device or is generated by a host device in communication with the memory device;
        identify a voltage pattern to be used to execute the read command based on whether the read command is generated by the memory device or is generated by the host device,
            wherein a first voltage pattern is identified if the read command is generated by the host device and a second voltage pattern is identified if the read command is generated by the memory device,
            wherein the second voltage pattern is different from the first voltage pattern,
            and wherein:
                the second voltage pattern consumes less power than the first voltage pattern, or
                the second voltage pattern is associated with a longer read time than the first voltage pattern; and
        apply the identified voltage pattern to perform a read operation based on the read command,
            wherein the first voltage pattern is applied if the read command is generated by the host device and the second voltage pattern is applied if the read command is generated by the memory device.

2. The memory device of claim 1, wherein the second voltage pattern is identified based on a determination that the read command is associated with a data integrity scan initiated by the memory device.

3. The memory device of claim 1, wherein the second voltage pattern is identified based on a determination that the read command is associated with an error handling operation initiated by the memory device.

4. The memory device of claim 1, wherein the first voltage pattern corresponds to a reverse read operation in which:
    a read voltage, used for a series of read instances included in the reverse read operation, decreases over time within the first voltage pattern, and
    memory cells are read only after the read voltage is stable.

5. The memory device of claim 1, wherein the second voltage pattern corresponds to a coarse reverse read operation in which:
    a read voltage, used for a series of read instances included in the coarse reverse read operation, decreases over time within the second voltage pattern, and
    memory cells are read prior to the read voltage being stable and after the read voltage is stable.

6. The memory device of claim 1, wherein the second voltage pattern corresponds to a forward read operation in which a read voltage, used for a series of read instances included in the forward read operation, increases over time within the second voltage pattern.

7. The memory device of claim 1, wherein the first voltage pattern corresponds to a first type of reverse read operation in which a first read voltage, used for a first series of read instances included in the first type of reverse read operation, decreases over time within the first voltage pattern, and
    wherein the second voltage pattern corresponds to a second type of reverse read operation in which a second read voltage, used for a second series of read instances included in the second type of reverse read operation, decreases over time within the second voltage pattern.

8. The memory device of claim 7, wherein the second type of reverse read operation consumes less power for read operations as compared to the first type of reverse read operation.

9. The memory device of claim 7, wherein the second type of reverse read operation is associated with longer read times for read operations as compared to the first type of reverse read operation.

10. The memory device of claim 1, wherein the second voltage pattern is identified based on a determination that the read command is associated with at least one of a data verification operation, a corrective read operation, or an idle mode operation.

11. A method, comprising:
    detecting, by a memory device, a read command associated with reading data stored by the memory device;
    determining, by the memory device, whether the read command is from a host device in communication with the memory device;
    selecting, by the memory device and based on whether the read command is from the host device, one of a first voltage pattern or a second voltage pattern to be applied to memory cells of the memory device to execute the read command, wherein the first voltage pattern is selected if the read command is from the host device and the second voltage pattern is selected if the read command is not from the host device, wherein the second voltage pattern is different from the first voltage pattern, and wherein:

the second voltage pattern consumes less power than the first voltage pattern, or the second voltage pattern is associated with a longer read time than the first voltage pattern; and executing, by the memory device, the read command using a selected one of the first voltage pattern or the second voltage pattern.

12. The method of claim 11, wherein the second voltage pattern is selected based on a determination that the read command is generated internally by the memory device.

13. The method of claim 11, wherein the second voltage pattern is selected based on a determination that the read command is associated with at least one of a data integrity scan, a data verification operation, an error handling operation, a corrective read operation, or an idle mode operation.

14. The method of claim 11, wherein the first voltage pattern corresponds to a first type of reverse read operation in which a first read voltage, used for a first series of read instances included in the first type of reverse read operation, decreases over time within the first voltage pattern.

15. The method of claim 14, wherein the second voltage pattern corresponds to a second type of reverse read operation in which a second read voltage, used for a second series of read instances included in the second type of reverse read operation, decreases over time within the second voltage pattern, wherein the second type of reverse read operation is different from the first type of reverse read operation.

16. The method of claim 15, wherein the second type of reverse read operation consumes less power for read operations as compared to the first type of reverse read operation.

17. The method of claim 15, wherein the second type of reverse read operation is associated with longer read times for read operations as compared to the first type of reverse read operation.

18. The method of claim 11, wherein the second voltage pattern corresponds to a forward read operation in which a read voltage, used for a series of read instances included in the forward read operation, increases over time within the second voltage pattern.

19. A system, comprising:

means for selecting a voltage pattern from a set of voltage patterns that includes a first voltage pattern and a second voltage pattern, to be applied to memory cells during a read operation, based on a type of read command for which the read operation is to be performed, wherein:

the second voltage pattern consumes less power than the first voltage pattern, or the second voltage pattern is associated with a longer read time than the first voltage pattern; and means for applying the voltage pattern to the memory cells to perform the read operation.

20. The system of claim 19, wherein the means for selecting the voltage pattern based on the type of read command comprises:

means for selecting the first voltage pattern based on a determination that the read command is a host read command, or means for selecting the second voltage pattern based on a determination that the read command is not a host read command, wherein the second voltage pattern is different from the first voltage pattern.

21. The system of claim 19, wherein the second voltage pattern is selected based on a determination that the read command is associated with a data integrity scan or an error handling operation to be applied to the memory cells.

22. The system of claim 19, wherein the first voltage pattern corresponds to a first type of reverse read operation, and wherein the second voltage pattern corresponds to a second type of reverse read operation that is different from the first type of reverse read operation.

23. The system of claim 19, wherein the first voltage pattern corresponds to a reverse read operation, and wherein the second voltage pattern corresponds to a coarse reverse read operation.

24. The system of claim 19, wherein the first voltage pattern corresponds to a reverse read operation, and wherein the second voltage pattern corresponds to a forward read operation.

25. The system of claim 19, wherein the second voltage pattern is selected based on a determination that the read command is associated with at least one of a data verification operation, a corrective read operation, or an idle mode operation.

* * * * *